(12) United States Patent
Kim et al.

(10) Patent No.: US 10,446,789 B2
(45) Date of Patent: Oct. 15, 2019

(54) DISPLAY DEVICE

(71) Applicant: LG Display Co., Ltd., Seoul (KR)

(72) Inventors: Eunah Kim, Chungcheongnam-do (KR); Miae Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/278,077

(22) Filed: Feb. 16, 2019

(65) Prior Publication Data

US 2019/0181377 A1 Jun. 13, 2019

Related U.S. Application Data

(62) Division of application No. 15/392,076, filed on Dec. 28, 2016, now Pat. No. 10,224,503.

(30) Foreign Application Priority Data

Jul. 21, 2016 (KR) .................. 10-2016-0092729

(51) Int. Cl.
| | | |
|---|---|---|
| *H01L 51/52* | (2006.01) | |
| *H01L 27/32* | (2006.01) | |
| *H01L 51/00* | (2006.01) | |
| *H01L 51/56* | (2006.01) | |

(52) U.S. Cl.
CPC ...... *H01L 51/5246* (2013.01); *H01L 27/3276* (2013.01); *H01L 51/0097* (2013.01); *H01L 51/56* (2013.01); *H01L 27/3272* (2013.01); *H01L 2227/323* (2013.01); *H01L 2251/5338* (2013.01)

(58) Field of Classification Search
CPC . H01L 21/02; H01L 51/5246; H01L 51/0097; H01L 51/56
See application file for complete search history.

(56) References Cited

U.S. PATENT DOCUMENTS

| | | |
|---|---|---|
| 2005/0110023 A1 | 5/2005 | Lee et al. |
| 2012/0299888 A1 | 11/2012 | Kim et al. |
| 2013/0026476 A1 | 1/2013 | Park et al. |

(Continued)

FOREIGN PATENT DOCUMENTS

| | | |
|---|---|---|
| JP | 2006-049514 A | 2/2006 |
| JP | 2010-225845 A | 10/2010 |

(Continued)

OTHER PUBLICATIONS

Office Action dated Sep. 21, 2017 from the Korean Intellectual Property Office in related Korean application No. 10-2016-0092729.

(Continued)

*Primary Examiner* — Douglas M Menz
(74) *Attorney, Agent, or Firm* — Morgan, Lewis & Bockius LLP

(57) ABSTRACT

A display device and a method of manufacturing a display device are provided. A display device includes a substrate; a display area on the substrate and configured to display an image; a pad portion on at least one edge of the substrate, the pad portion including at least one sink portion; an anisotropic conductive film on the pad portion and filling the at least one sink portion, the anisotropic conductive film spaced apart from an end of the substrate; and a flexible printed circuit board on the anisotropic conductive film and electrically connected to the pad portion.

13 Claims, 19 Drawing Sheets

(56) References Cited

U.S. PATENT DOCUMENTS

| | | |
|---|---|---|
| 2013/0033834 A1 | 2/2013 | Kwon et al. |
| 2014/0140019 A1 | 5/2014 | Park et al. |
| 2015/0108452 A1 | 4/2015 | Park et al. |
| 2015/0287750 A1 | 10/2015 | Youn et al. |

FOREIGN PATENT DOCUMENTS

| | | |
|---|---|---|
| JP | 2012-042662 A | 3/2012 |
| JP | 2013-011770 A | 1/2013 |
| KR | 10-2014-0063305 A | 5/2014 |

OTHER PUBLICATIONS

Office Action dated Sep. 30, 2017 from the Taiwan Patent Office in related Taiwanese application No. 105143042.

Preliminary Notice of Reasons for Rejection Office Action dated Oct. 24, 2017 from the Japanese Patent Office in related Japanese application No. 2016-254873.

Image of sink portion

DISPLAY DEVICE

This application is a divisional of U.S. patent application Ser. No. 15/392,076, filed Dec. 28, 2016, which claims the benefit of Korean Patent Application No. 10-2016-0092729 filed on Jul. 21, 2016, both of which are incorporated herein by reference for all purposes as if fully set forth herein.

BACKGROUND

Field of the Invention

The present disclosure relates to a display device, and more particularly, to a display device for preventing a defective drive and improving production yield.

Discussion of the Related Art

With the development of information society, demands for display devices displaying an image are increasing in various ways. In a field of the display devices, a large-sized cathode ray tube (CRT) has been rapidly replaced by a flat panel display (FPD) having advantages of a thin profile, low weight, and a large-sized screen. Examples of the flat panel display include a liquid crystal display (LCD), a plasma display panel (PDP), an organic light emitting diode (OLED) display, and an electrophoresis display (EPD).

An OLED display includes self-emitting elements capable of emitting light by themselves and has advantages of a fast response time, a high emission efficiency, a high luminance, and a wide viewing angle. In particular, the OLED display may use a flexible plastic substrate. In addition, the OLED display has advantages of a lower driving voltage, lower power consumption, and better color tone as compared to a plasma display panel or an inorganic electroluminescent display.

The OLED display using the flexible plastic substrate is manufactured by coating polyimide on a glass substrate, forming components, such as a thin film transistor and an organic light emitting diode, and attaching a chip-on-film (COF) to a pad portion. Further, a process for separating the glass substrate from the polyimide substrate is performed. Hence, the OLED display including a flexible polyimide substrate is manufactured.

The process for attaching the chip-on-film to the pad portion of the OLED display is performed by forming an anisotropic conductive film on the chip-on-film and then performing a tap bonding process on the pad portion. The tap bonding process is performed to press the pad portion, the anisotropic conductive film, and the chip-on-film to electrically connect the pad portion with the chip-on-film using conductive balls of the anisotropic conductive film. However, the anisotropic conductive film overflows from an end of the substrate depending on an amount or a pressure of the anisotropic conductive film. There is a problem that the glass substrate and the polyimide substrate are adhered by the anisotropic conductive film. Thus, the subsequent process of separating the glass substrate from the polyimide substrate is difficult.

SUMMARY

Accordingly, the present disclosure is directed to a display device that substantially obviates one or more of the problems due to limitations and disadvantages of the related art.

An object of the present disclosure is to provide a display device capable of preventing an anisotropic conductive film from overflowing from a substrate by forming a sink portion in a pad portion.

Another object of the present disclosure is to provide a display device capable of preventing a defective drive and increasing production yield by securing reliability of a separation process of a glass substrate.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a display device comprises a substrate; a display area on the substrate and configured to display an image; a pad portion on at least one edge of the substrate, the pad portion including at least one sink portion; an anisotropic conductive film on the pad portion and filling the at least one sink portion, the anisotropic conductive film spaced apart from an end of the substrate; and a flexible printed circuit board on the anisotropic conductive film and electrically connected to the pad portion.

In another aspect, a method of manufacturing a display device comprises providing a substrate, the substrate defining a display area on the substrate and configured to display an image, and a pad portion on at least one edge of the substrate, the pad portion including at least one sink portion; forming an anisotropic conductive film on the pad portion and filling the at least one sink portion, the anisotropic conductive film spaced apart from an end of the substrate; and providing a flexible printed circuit board on the anisotropic conductive film and electrically connected to the pad portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention. Names of the respective elements used in the following explanations are selected only for convenience of writing the specification and may be thus different from those used in actual products.

A display device according to an example embodiment is a plastic display device, in which a display element is formed on a flexible plastic substrate. Examples of the plastic display device include an organic light emitting diode (OLED) display, a liquid crystal display (LCD), and an electrophoresis display. Embodiments are described using the OLED display by way of example. An OLED display includes an emission layer, that is formed of an organic material, between a first electrode serving as an anode and a second electrode serving as a cathode. The OLED display is a self-emission display device configured to form hole-electron pairs, i.e., excitons, by combining holes received from the first electrode and electrons received from the second electrode inside the emission layer and emit light by energy generated when the excitons return to a ground level. The OLED display according to the embodiment may alternatively use a glass substrate rather than a plastic substrate.

Example embodiments are described below with reference to FIGS. 1 to 20.

Figure 1:
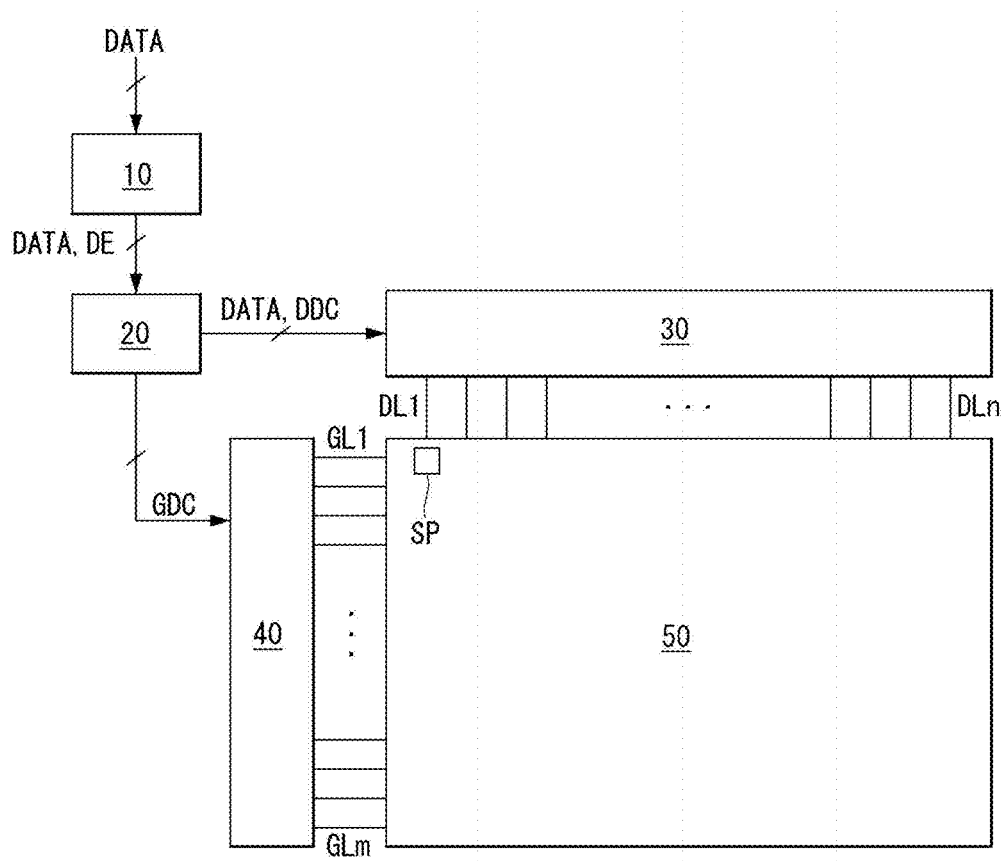
FIG. 1 is a schematic block diagram of an organic light emitting diode (OLED) display.
Figure 2:
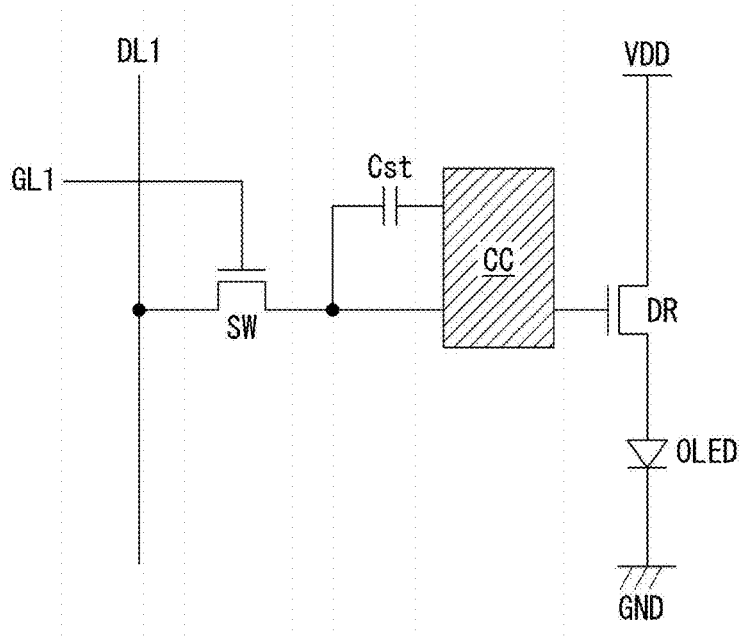
FIG. 2 illustrates a first example of a circuit configuration of a subpixel.
Figure 3:
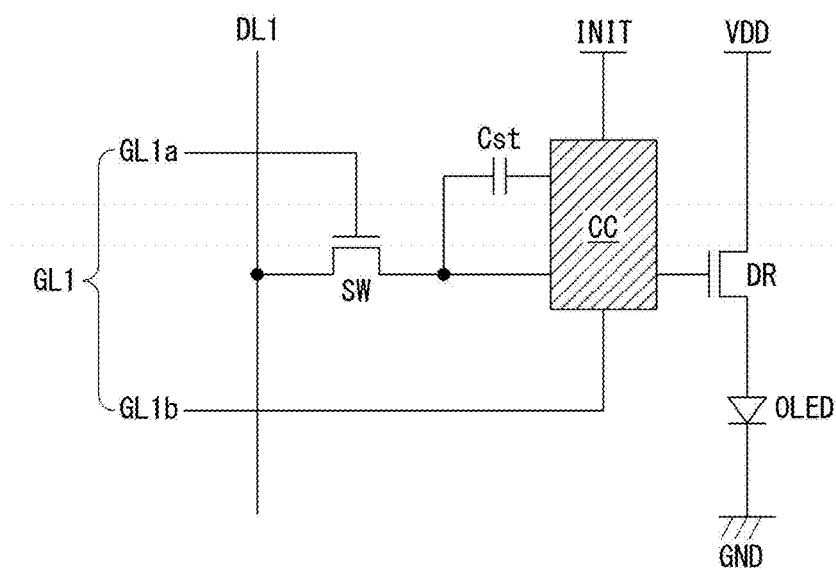
FIG. 3 illustrates a second example of a circuit configuration of a subpixel.

FIG. 1 is a block diagram of an OLED display. FIG. 2 illustrates a first example of a circuit configuration of a subpixel. FIG. 3 illustrates a second example of a circuit configuration of a subpixel.

With reference to FIG. 1, an OLED display according to an example embodiment includes an image processing unit 10, a timing controller 20, a data driver 30, a gate driver 40, and a display panel 50. The image processing unit 10 outputs a data signal DATA and a data enable signal DE supplied from the outside. The image processing unit 10 may output one or more of a vertical sync signal, a horizontal sync signal, and a clock signal in addition to the data enable signal DE. For the sake of brevity and ease of reading, these signals are not shown. The image processing unit 10 is formed on a system circuit board in an integrated circuit (IC) form.

The timing controller 20 receives the data signal DATA and driving signals including the data enable signal DE or the vertical sync signal, the horizontal sync signal, the clock signal, etc. from the image processing unit 10. The timing controller 20 outputs a gate timing control signal GDC for controlling operation timing of the gate driver 40 and a data timing control signal DDC for controlling operation timing of the data driver 30 based on the driving signals. The timing controller 20 may be formed on a control circuit board as an integrated circuit (IC).

The data driver 30 samples and latches the data signal DATA received from the timing controller 20 in response to the data timing control signal DDC supplied from the timing controller 20 and converts the sampled and latched data signal DATA using gamma reference voltages. The data driver 30 outputs the converted data signal DATA to data lines DL1 to DLn. The data driver 30 is attached to a substrate as an IC.

The gate driver 40 outputs a gate signal while shifting a level of a gate voltage in response to the gate timing control signal GDC supplied from the timing controller 20. The gate driver 40 outputs the gate signal to gate lines GL1 to GLm. The gate driver 40 is formed on a gate circuit board in an IC form or is formed on the display panel 50 in a gate-in panel (GIP) manner. The display panel 50 displays an image in response to the data signal DATA and the gate signal respectively received from the data driver 30 and the gate driver 40. The display panel 50 includes subpixels SP for displaying an image.

As shown in FIG. 2, each subpixel may include a switching transistor SW, a driving transistor DR, a compensation circuit CC, and an organic light emitting diode (OLED). The OLED operates to emit light based on a driving current generated by the driving transistor DR.

The switching transistor SW performs a switching operation so that a data signal supplied through a first data line DL1 is stored in a capacitor as a data voltage in response to a gate signal supplied through a first gate line GL1. The driving transistor DR enables a driving current to flow between a high potential power line VDD and a low potential power line GND based on the data voltage stored in the capacitor. The compensation circuit CC is a circuit for compensating for a threshold voltage of the driving transistor DR. A capacitor connected to the switching transistor SW or the driving transistor DR may be mounted inside the compensation circuit CC.

The compensation circuit CC includes one or more thin film transistors (TFTs) and a capacitor. Configuration of the compensation circuit CC may be variously changed depending on a compensation method. A brief description of the compensation circuit CC will be made.

As shown in FIG. 3, the subpixel including the compensation circuit CC may further include a signal line and a power line for driving a compensation TFT and supplying a predetermined signal or electric power. The added signal line may be defined as a 1-2 gate line GL1b for driving the compensation TFT included in the subpixel. In FIG. 3, "GL1a" is a 1-1 gate line for driving the switching transistor SW. The added power line may be defined as an initialization power line INIT for initializing a predetermined node of the subpixel at a predetermined voltage. However, this is merely an example, and embodiments are not limited thereto.

FIGS. 2 and 3 illustrate that one subpixel includes the compensation circuit CC by way of example. However, the compensation circuit CC may be omitted when an object (for example, the data driver 30) to be compensated is positioned outside the subpixel. The subpixel has a configuration of 2T (Transistor) 1C (Capacitor) in which the switching transistor SW, the driving transistor DR, the capacitor, and the OLED are provided. However, when the compensation circuit CC is added to the subpixel, the subpixel may have various configurations such as 3T1C, 4T2C, 5T2C, 6T2C, 7T2C, and the like.

Also, FIGS. 2 and 3 illustrate that the compensation circuit CC is positioned between the switching transistor SW and the driving transistor DR by way of an example. However, the compensation circuit CC may be further positioned between the driving transistor DR and the OLED. The position and the structure of the compensation circuit CC are not limited to the ones illustrated in FIGS. 2 and 3.

Figure 4:
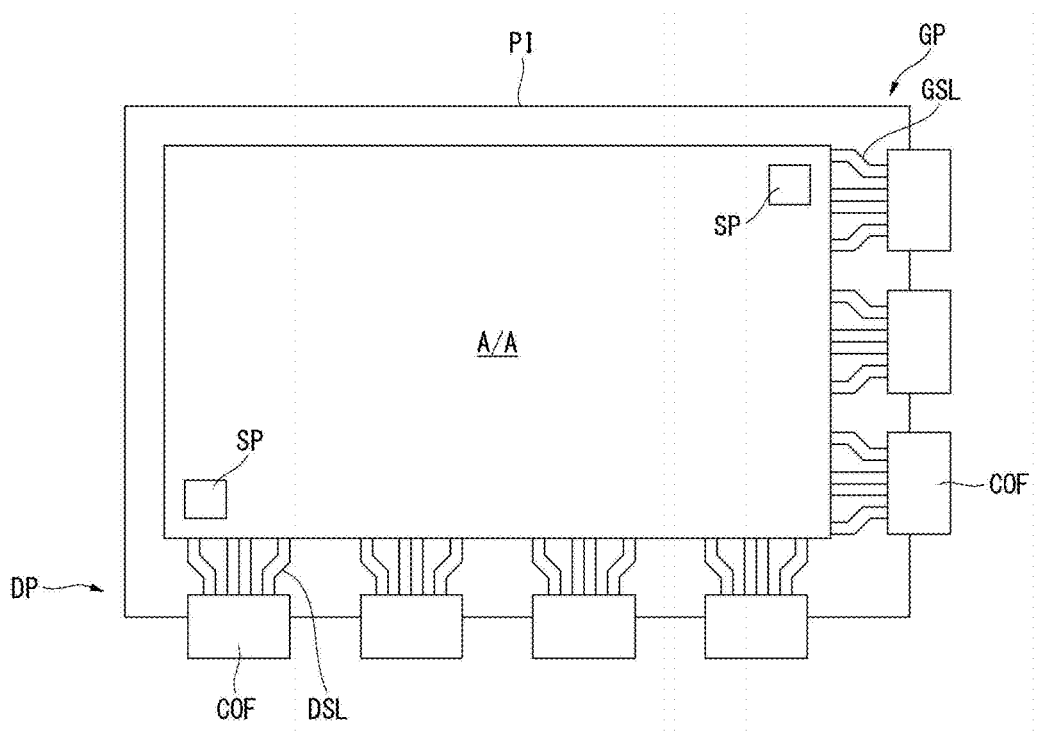
FIG. 4 is a plan view of an OLED display according to a first example embodiment.
Figure 5:
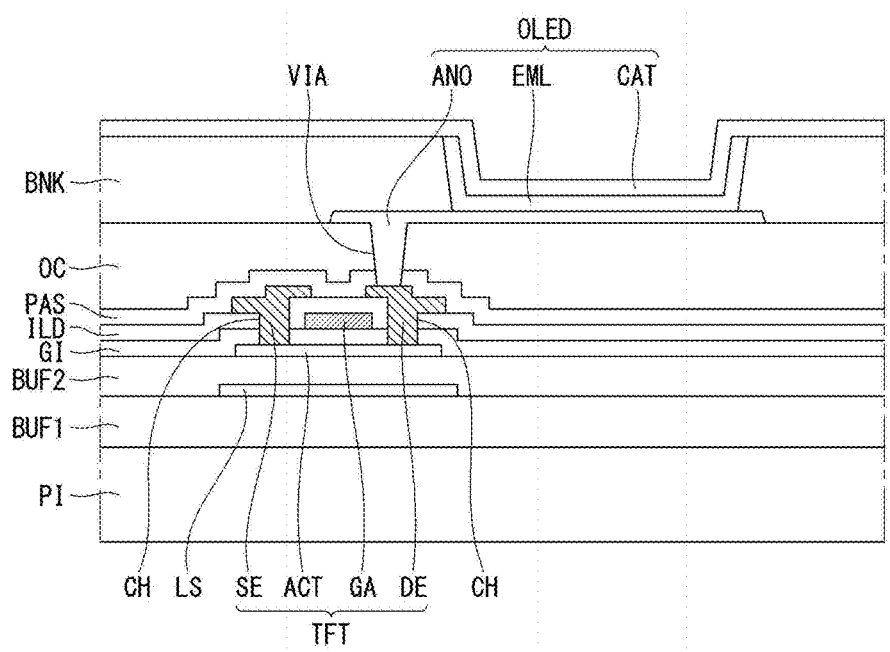
FIG. 5 is a cross-sectional view illustrating a subpixel of an OLED display according to the first example embodiment.
Figure 6:
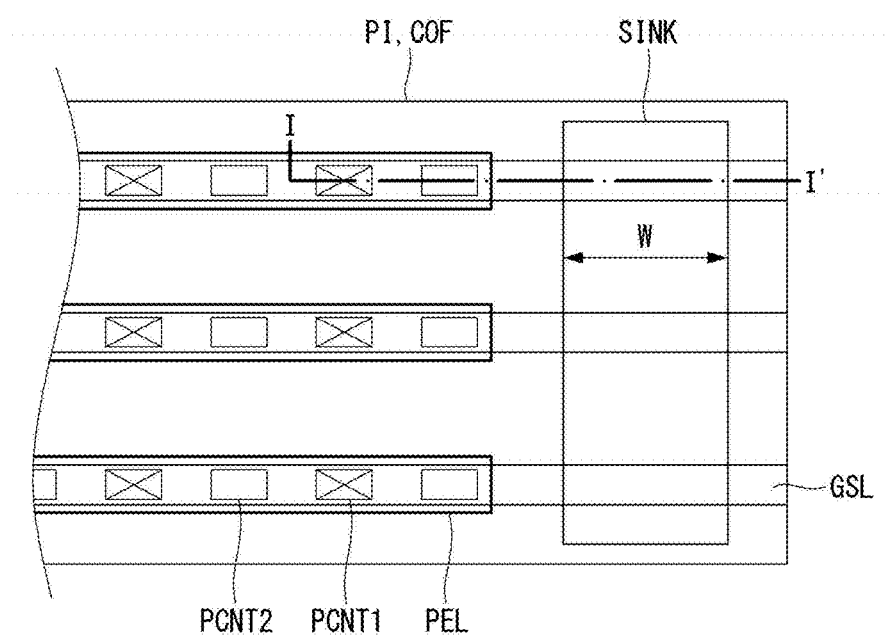
FIG. 6 is an enlarged plan view of a gate pad portion shown in FIG. 4.
Figure 7:
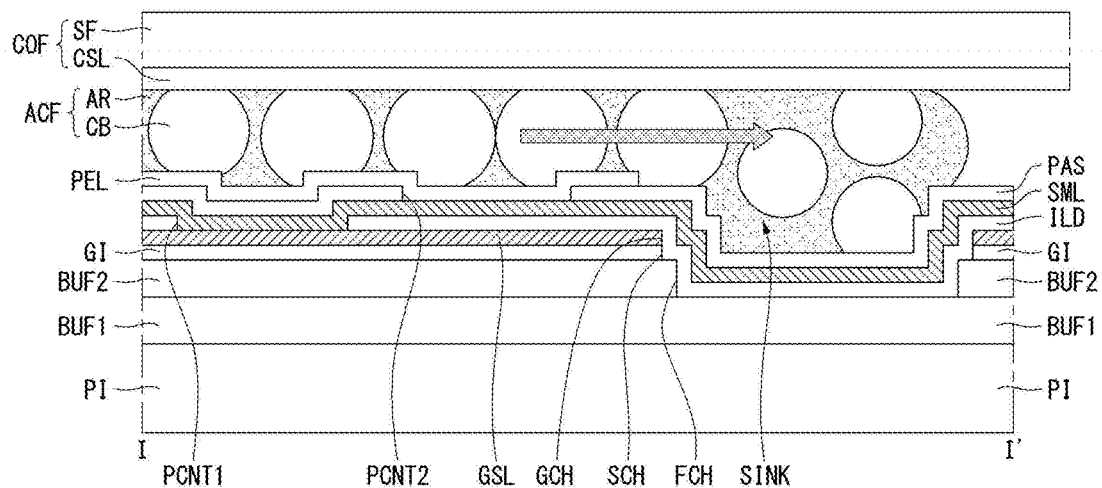
FIG. 7 is a cross-sectional view taken along line I-I' of FIG. 6.
Figure 8:
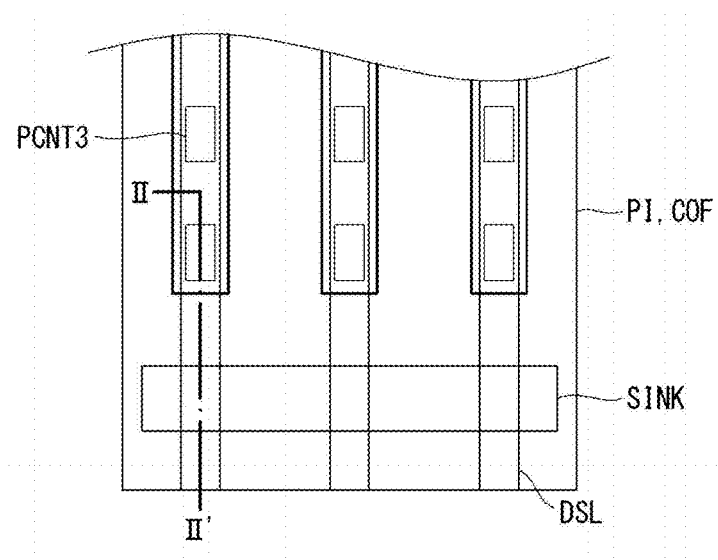
FIG. 8 is an enlarged plan view of a data pad portion shown in FIG. 4.
Figure 9:
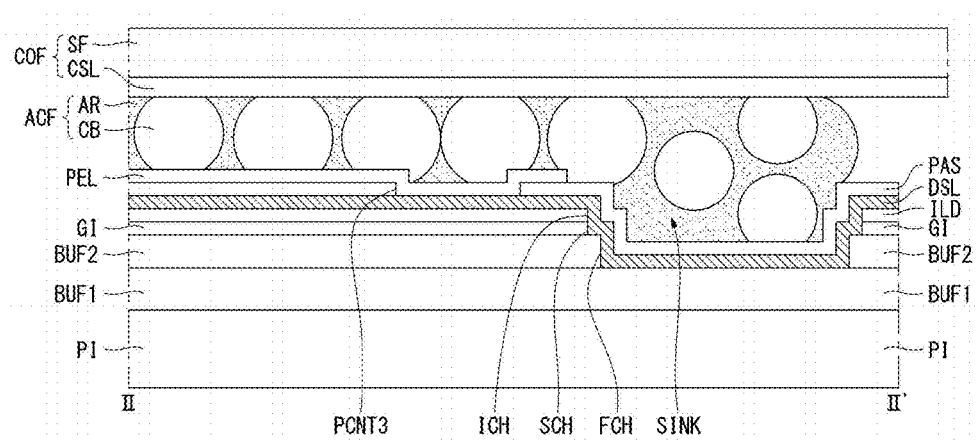
FIG. 9 is a cross-sectional view taken along line II-II' of FIG. 8.

FIG. 4 is a plan view of an OLED display according to a first example embodiment. FIG. 5 is a cross-sectional view illustrating a subpixel of an OLED display according to the first embodiment. FIG. 6 is an enlarged plan view of a gate pad portion shown in FIG. 4. FIG. 7 is a cross-sectional view taken along line I-I' of FIG. 6. FIG. 8 is an enlarged plan view of a data pad portion shown in FIG. 4. FIG. 9 is a cross-sectional view taken along line II-II' of FIG. 8. FIGS. 10 to 13 are plan views illustrating an OLED display according to the first embodiment.

With reference to FIG. 4, an OLED display may include a substrate PI, a display area A/A, and a gate pad portion GP and a data pad portion DP surrounding the display area A/A. A plurality of subpixels SP is disposed in the display area A/A. The subpixels SP may be disposed in R (red), G (green), B (blue) subpixel arrangement or R, B, W (white) subpixel arrangement in the display area A/A to represent a full color. The gate pad portion GP is disposed on one side (for example, the left or right side) of the display area A/A, and gate signal lines GSL extended from the display area A/A are disposed in the gate pad portion GP. The data pad portion DP is disposed on one side (for example, the lower side) of the display area A/A, and data signal lines DSL extended from the display area A/A are disposed in the data pad portion DP. The gate signal line GSL is supplied with a gate signal through a flexible printed circuit board COF attached to the gate pad portion GP. The data signal line DSL is supplied with a data signal through a flexible printed circuit board COF attached to the data pad portion DP.

A cross-sectional structure of a subpixel SP of an OLED display according to an example embodiment is described below with reference to FIG. 5.

As shown in FIG. 5, in an OLED display according to an example embodiment, a first buffer layer BUF1 is positioned on a substrate PI. The substrate PI may be made of plastic and, for example, may be a polyimide substrate. Thus, the substrate PI according to the embodiment may have flexible characteristic. The first buffer layer BUF1 protects a thin film transistor formed in a subsequent process from impurities, for example, alkali ions discharged from the substrate PI. The first buffer layer BUF1 may be a silicon oxide (SiOx) layer, a silicon nitride (SiNx) layer, or a multilayer thereof.

A shield layer LS is positioned on the first buffer layer BUF1. The shield layer LS prevents a reduction in a panel driving current which may be generated by using a polyimide substrate. A second buffer BUF2 is positioned on the shield layer LS. The second buffer BUF2 protects a thin film transistor formed in a subsequent process from impurities, for example, alkali ions discharged from the shield layer LS. The second buffer layer BUF2 may be a silicon oxide (SiOx) layer, a silicon nitride (SiNx) layer, or a multilayer thereof.

A semiconductor layer ACT is positioned on the second buffer layer BUF2 and may be formed of a silicon semiconductor or an oxide semiconductor. The silicon semiconductor may include amorphous silicon or crystallized polycrystalline silicon. The polycrystalline silicon has a high mobility (for example, more than 100 cm$^2$/Vs), low power consumption, and excellent reliability. Thus, the polycrystalline silicon can be applied to a gate driver and/or a multiplexer (MUX) for use in a driving element or applied to a driving TFT of each pixel of the OLED display. Because the oxide semiconductor has a low OFF-current, the oxide semiconductor is suitable for a switching TFT which has a short ON-time and a long OFF-time. Further, because the oxide semiconductor increases a voltage hold time of the pixel due to the low off-current, the oxide semiconductor is suitable for a display device requiring a low-speed drive and/or low power consumption. In addition, the semiconductor layer ACT includes a drain region and a source region each including p-type or n-type impurities, and also includes a channel region between the drain region and the source region.

A gate insulating layer GI is positioned on the semiconductor layer ACT and may be a silicon oxide (SiOx) layer, a silicon nitride (SiNx) layer, or a multilayer thereof. A gate electrode GA is positioned on the gate insulating layer GI at a location corresponding to a predetermined region (i.e., the channel region when impurities are injected) of the semiconductor layer ACT. The gate electrode GA may be formed of one of molybdenum (Mo), aluminum (Al), chrome (Cr), gold (Au), titanium (Ti), nickel (Ni), neodymium (Nd), copper (Cu), or a combination thereof. Further, the gate electrode GA may be a multilayer formed of one of molybdenum (Mo), aluminum (Al), chrome (Cr), gold (Au), titanium (Ti), nickel (Ni), neodymium (Nd), copper (Cu), or a combination thereof. For example, the gate electrode GA may be formed as a double layer of Mo/Al—Nd or Mo/Al.

An interlayer dielectric layer ILD is positioned on the gate electrode GA and insulates the gate electrode GA. The interlayer dielectric layer ILD may be a silicon oxide (SiOx) layer, a silicon nitride (SiNx) layer, or a multilayer thereof. Contact holes CH exposing a portion of the semiconductor layer ACT are formed in a portion of each of the interlayer dielectric layer ILD and the gate insulating layer GI.

A drain electrode DE and a source electrode SE are positioned on the interlayer dielectric layer ILD. The drain electrode DE is connected to the semiconductor layer ACT through the contact hole CH exposing the drain region of the semiconductor layer ACT, and the source electrode SE is connected to the semiconductor layer ACT through the contact hole CH exposing the source region of the semiconductor layer ACT. Each of the source electrode SE and the drain electrode DE may be formed as a single layer or as a multilayer. When each of the source electrode SE and the drain electrode DE is formed as the single layer, each of the source electrode SE and the drain electrode DE may be formed of one of molybdenum (Mo), aluminum (Al), chrome (Cr), gold (Au), titanium (Ti), nickel (Ni), neodymium (Nd), copper (Cu), or a combination thereof. When each of the source electrode SE and the drain electrode DE is formed as the multilayer, each of the source electrode SE and the drain electrode DE may be formed as a double layer of Mo/Al—Nd or as a triple layer of Ti/Al/Ti, Mo/Al/Mo or Mo/Al—Nd/Mo. Thus, a thin film transistor TFT including the semiconductor layer ACT, the gate electrode GA, the source electrode SE, and the drain electrode DE is formed.

Further, a passivation layer PAS is positioned on the substrate PI including the thin film transistor TFT. The passivation layer PAS is an insulating layer protecting the component underlying the passivation layer PAS and may be a silicon oxide (SiOx) layer, a silicon nitride (SiNx) layer, or a multilayer thereof. An overcoat layer OC is positioned on the passivation layer PAS. The overcoat layer OC may be a planarization layer for reducing a height difference of an underlying structure and may be formed of an organic material such as polyimide, benzocyclobutene-based resin, and acrylate. For example, the overcoat layer OC may be formed through a spin-on glass (SOG) method for coating the organic material in a liquid state and then curing the organic material.

A via hole VIA exposing the drain electrode DE of the thin film transistor TFT is positioned in a portion of the overcoat layer OC. An organic light emitting diode OLED is positioned on the overcoat layer OC. More specifically, a first electrode ANO is positioned on the overcoat layer OC. The first electrode ANO serves as a pixel electrode and is connected to the drain electrode DE of the thin film transistor TFT through the via hole VIA. The first electrode ANO is an anode and may be formed of a transparent conductive material such as indium tin oxide (ITO), indium zinc oxide (IZO), and zinc oxide (ZnO). When the first electrode ANO is a reflective electrode, the first electrode ANO may further include a reflective layer. The reflective layer may be formed of aluminum (Al), copper (Cu), silver (Ag), nickel (Ni), palladium (Pd) or a combination thereof. For example, the reflective layer may be formed of an Ag/Pd/Cu (APC) alloy.

In addition, a bank layer BNK defining pixels is positioned on the substrate PI including the first electrode ANO. The bank layer BNK may be formed of an organic material such as polyimide, benzocyclobutene-based resin, and acrylate. The bank layer BNK includes a pixel definition portion exposing the first electrode ANO. An emission layer EML contacting the first electrode ANO is positioned in the pixel definition portion of the bank layer BNK. The emission layer EML is a layer, in which electrons and holes combine and emit light. A hole injection layer and/or a hole transport layer may be positioned between the emission layer EML and the first electrode ANO, and an electron injection layer and/or an electron transport layer may be positioned on the emission layer EML.

A second electrode CAT is positioned on the emission layer EML and may be positioned on an entire surface of the display area A/A (see FIG. 4) of the substrate PI. In addition, the second electrode CAT is a cathode electrode and may be formed of magnesium (Mg), calcium (Ca), aluminum (Al), silver (Ag), or a combination thereof each having a low work function. When the second electrode CAT is a transmissive electrode, the second electrode CAT may be thin enough to transmit light. Further, when the second electrode CAT is a reflective electrode, the second electrode CAT may be thick enough to reflect light.

In an example OLED display, a flexible printed circuit board is attached to the gate pad portion and the data pad portion through an anisotropic conductive film.

A detailed configuration of the gate pad portion will be described with reference to FIGS. 6 and 7. The first buffer layer BUF1 is positioned on the substrate PI, and the second buffer layer BUF2 is positioned on the first buffer layer BUF1. The second buffer layer BUF2 has a first hole FCH in its portion. The gate insulating layer GI is positioned on the second buffer layer BUF2 and has a second hole SCH in its portion. The second hole SCH of the gate insulating layer GI is disposed corresponding to the first hole FCH of the second buffer layer BUF2.

The gate signal line GSL is positioned on the gate insulating layer GI. The gate signal line GSL is a line extended from the gate line of the display area and has a third hole GCH in its portion. The third hole GCH of the gate signal line GSL is disposed corresponding to the first hole FCH of the second buffer layer BUF2 and the second hole SCH of the gate insulating layer GI. The interlayer dielectric layer ILD is positioned on the gate signal line GSL and insulates the gate signal line GSL. The interlayer dielectric layer ILD has a first contact hole PCNT1 in its portion and exposes the gate signal line GSL through the first contact hole PCNT1. The interlayer dielectric layer ILD covers the first hole FCH of the second buffer layer BUF2, the second hole SCH of the gate insulating layer GI, and the third hole GCH of the gate signal line GSL.

A source metal layer SML is positioned on the interlayer dielectric layer ILD and is connected to the gate signal line GSL through the first contact hole PCNT1 of the interlayer dielectric layer ILD. The source metal layer SML is formed along the interlayer dielectric layer ILD and covers the first hole FCH of the second buffer layer BUF2, the second hole SCH of the gate insulating layer GI, and the third hole GCH of the gate signal line GSL. The passivation layer PAS is positioned on the source metal layer SML and has a second contact hole PCNT2 exposing the source metal layer SML in its portion. The passivation layer PAS is formed along the source metal layer SML and covers the first hole FCH of the second buffer layer BUF2, the second hole SCH of the gate insulating layer GI, and the third hole GCH of the gate signal line GSL. A pad electrode PEL is positioned on the passivation layer PAS. The pad electrode PEL may be formed using the same material as the first electrode of the display area and is connected to the source metal layer SML through the second contact hole PCNT2 of the passivation layer PAS. Thus, the gate pad portion including the first buffer layer BUF1, the second buffer layer BUF2, the gate insulating layer GI, the gate signal line GSL, the interlayer dielectric layer ILD, the source metal layer SML, the passivation layer PAS, and the pad electrode PEL is formed.

A flexible printed circuit board COF is attached to the substrate PI of the gate pad portion through an anisotropic conductive film ACF. The flexible printed circuit board COF may be a chip-on-film, in which a driver IC is included in a flexible film SF. The flexible printed circuit board COF includes a flexible printed circuit line CSL included in the flexible film SF. The anisotropic conductive film ACF is configured such that a plurality of conductive balls CB is distributed in an adhesive resin AR. The anisotropic conductive film ACF electrically connects the substrate PI to the flexible printed circuit board COF while attaching the substrate PI to the flexible printed circuit board COF. Namely, the conductive balls CB of the anisotropic conductive film ACF contact the pad electrode PEL and the flexible printed circuit line CSL and electrically connect the pad electrode PEL to the flexible printed circuit line CSL.

A sink portion SINK may be configured such that the first hole FCH of the second buffer layer BUF2, the second hole SCH of the gate insulating layer GI, and the third hole GCH of the gate signal line GSL are disposed to overlap one another. The sink portion SINK may be a kind of groove and may hold a portion of the anisotropic conductive film ACF. The sink portion SINK intersects the gate signal line GSL and prevents the anisotropic conductive film ACF from being pushed out when the anisotropic conductive film ACF is pressed. Further, because the sink portion SINK is spaced apart from an end of the substrate PI, the sink portion SINK can prevent the anisotropic conductive film ACF from overflowing from the end of the substrate PI. A width W of the sink portion SINK may be equal to or greater than 70 μm under the condition that the sink portion SINK is spaced apart from the end of the substrate PI. Hence, the sink portion SINK holds the anisotropic conductive film ACF and can prevent the anisotropic conductive film ACF from overflowing from the end of the substrate PI. However, embodiments are not limited thereto. The width W of the sink portion SINK may be as large as possible under the condition that the sink portion SINK is included in the gate pad portion, and thus the sink portion SINK can prevent the anisotropic conductive film ACF from overflowing from the end of the substrate PI.

A detailed configuration of the data pad portion will be described with reference to FIGS. 8 and 9. The first buffer layer BUF1 is positioned on the substrate PI, and the second buffer layer BUF2 is positioned on the first buffer layer BUF1. The second buffer layer BUF2 has a first hole FCH in its portion. The gate insulating layer GI is positioned on the second buffer layer BUF2 and has a second hole SCH in its portion. The second hole SCH of the gate insulating layer GI is disposed corresponding to the first hole FCH of the second buffer layer BUF2. The interlayer dielectric layer ILD is positioned on the gate insulating layer GI and has a fourth hole ICH in its portion. The fourth hole ICH of the interlayer dielectric layer ILD is disposed corresponding to the first hole FCH of the second buffer layer BUF2 and the second hole SCH of the gate insulating layer GI.

The data signal line DSL is positioned on the interlayer dielectric layer ILD. The data signal line DSL is a line extended from the data line of the display area and is extended to an end of the substrate PI. The data signal line DSL is formed along the interlayer dielectric layer ILD and covers the first hole FCH of the second buffer layer BUF2, the second hole SCH of the gate insulating layer GI, and the fourth hole ICH of the interlayer dielectric layer ILD. The passivation layer PAS is positioned on the data signal line DSL and has a third contact hole PCNT3 exposing the data signal line DSL in its portion. The passivation layer PAS is formed along the data signal line DSL and covers the first hole FCH of the second buffer layer BUF2, the second hole SCH of the gate insulating layer GI, and the fourth hole ICH of the interlayer dielectric layer ILD. A pad electrode PEL is positioned on the passivation layer PAS. The pad electrode PEL may be formed using the same material as the first electrode of the display area and is connected to the data signal line DSL through the third contact hole PCNT3 of the passivation layer PAS. Thus, the data pad portion including the first buffer layer BUF1, the second buffer layer BUF2, the gate insulating layer GI, the interlayer dielectric layer ILD, the data signal line DSL, the passivation layer PAS, and the pad electrode PEL is formed.

A flexible printed circuit board COF is attached to the substrate PI of the data pad portion through an anisotropic conductive film ACF. The flexible printed circuit board COF includes a flexible printed circuit line CSL included in a flexible film SF. The anisotropic conductive film ACF is configured such that a plurality of conductive balls CB is distributed in an adhesive resin AR. The anisotropic conductive film ACF electrically connects the substrate PI to the flexible printed circuit board COF while attaching the substrate PI to the flexible printed circuit board COF. Namely, the conductive balls CB of the anisotropic conductive film ACF contact the pad electrode PEL and the flexible printed circuit line CSL and electrically connect the pad electrode PEL to the flexible printed circuit line CSL.

In the embodiment, a sink portion SINK is configured such that the first hole FCH of the second buffer layer BUF2, the second hole SCH of the gate insulating layer GI, and the fourth hole ICH of the interlayer dielectric layer ILD are disposed to overlap one another. The sink portion SINK intersects the data signal line DSL and prevents the anisotropic conductive film ACF from being pushed out when the anisotropic conductive film ACF is pressed. Further, because the sink portion SINK is spaced apart from an end of the substrate PI, the sink portion SINK can prevent the anisotropic conductive film ACF from overflowing from the end of the substrate PI. A width W of the sink portion SINK may be equal to or greater than 70 μm under the condition that the sink portion SINK is spaced apart from the end of the substrate PI. Hence, the sink portion SINK holds the anisotropic conductive film ACF and can prevent the anisotropic conductive film ACF from overflowing from the end of the substrate PI. However, embodiments are not limited thereto. The width W of the sink portion SINK may be as large as possible under the condition that the sink portion SINK is included in the data pad portion, and thus the sink portion SINK can prevent the anisotropic conductive film ACF from overflowing from the end of the substrate PI.

Figure 10:
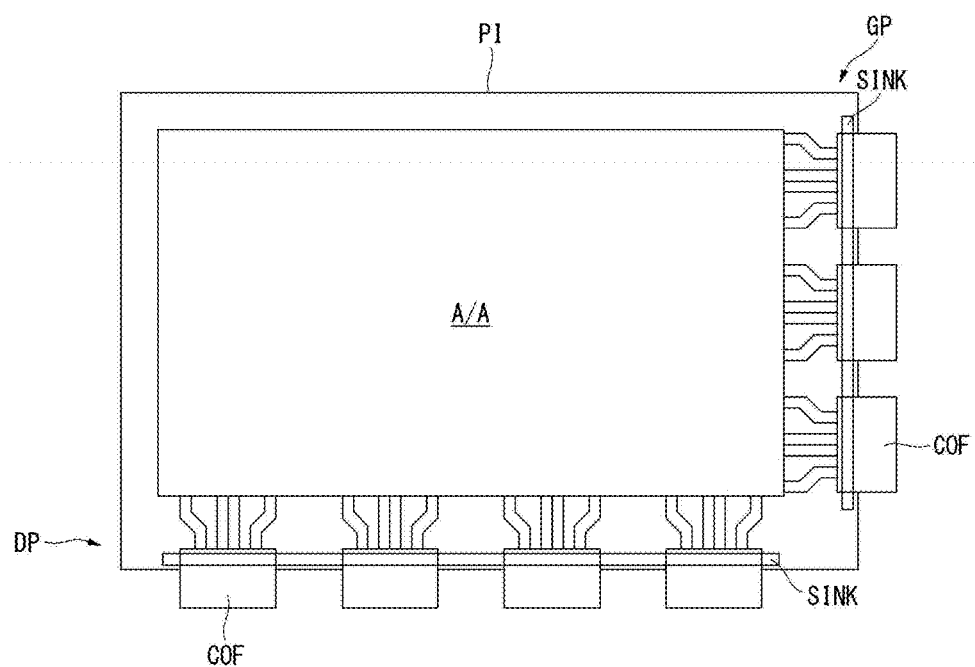
FIGS. 10 to 13 are plan views illustrating an OLED display according to a first example embodiment.

With reference to FIG. 10, the sink portion SINK may be included in each of the gate pad portion GP and the data pad portion DP. In this instance, the sink portion SINK of the gate pad portion GP may be continuously disposed in parallel with an end of the substrate PI. For example, one sink portion SINK of the gate pad portion GP may be disposed in parallel with an end of the substrate PI and may overlap all of three flexible printed circuit boards COF. Further, the sink portion SINK of the data pad portion DP may be continuously disposed in parallel with an end of the substrate PI. For example, one sink portion SINK of the data pad portion DP may be disposed in parallel with an end of the substrate PI and may overlap all of four flexible printed circuit boards COF.

Figure 11:
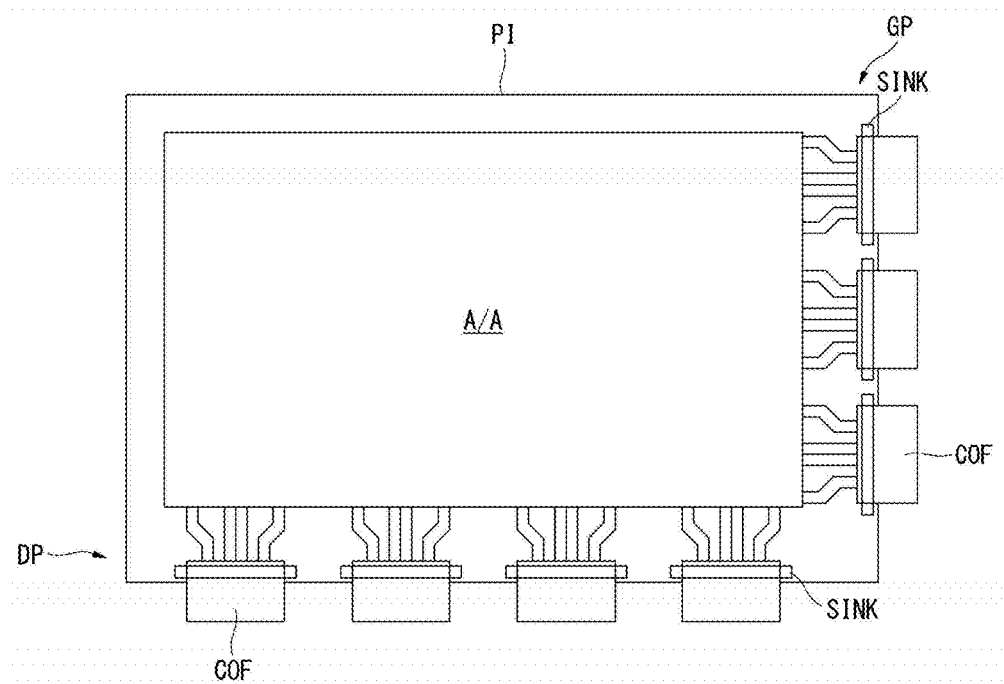

As shown in FIG. 11, the sink portion SINK may be included in each of the gate pad portion GP and the data pad portion DP. In this instance, the sink portion SINK of the gate pad portion GP may be discontinuously disposed in parallel with an end of the substrate PI. For example, three sink portions SINK of the gate pad portion GP may be disposed in parallel with an end of the substrate PI and may respectively overlap three flexible printed circuit boards COF. Further, the sink portion SINK of the data pad portion DP may be discontinuously disposed in parallel with an end of the substrate PI. For example, four sink portions SINK of the data pad portion DP may be disposed in parallel with an end of the substrate PI and may respectively overlap four flexible printed circuit boards COF.

Figure 12:
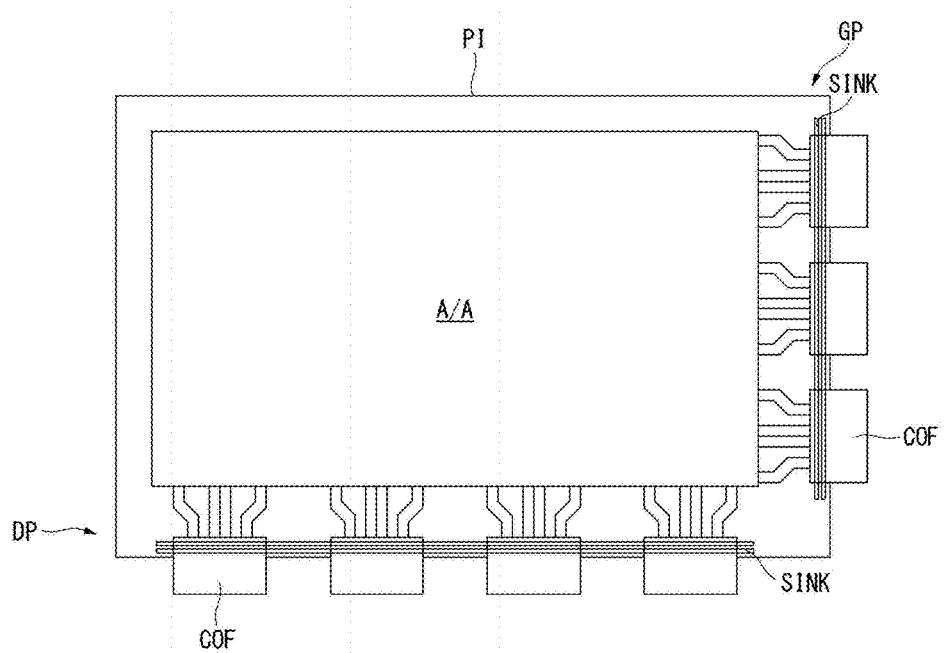

As illustrated in FIG. 12, the sink portion SINK may be included in each of the gate pad portion GP and the data pad portion DP. In this instance, the sink portion SINK of the gate pad portion GP may be continuously disposed in parallel with an end of the substrate PI and may be in plural. For example, two sink portions SINK of the gate pad portion GP may be disposed in parallel with an end of the substrate PI and may overlap all of three flexible printed circuit boards COF. Further, the sink portion SINK of the data pad portion DP may be continuously disposed in parallel with an end of the substrate PI and may be in plural. For example, two sink portions SINK of the data pad portion DP may be disposed in parallel with an end of the substrate PI and may overlap all of four flexible printed circuit boards COF.

Figure 13:
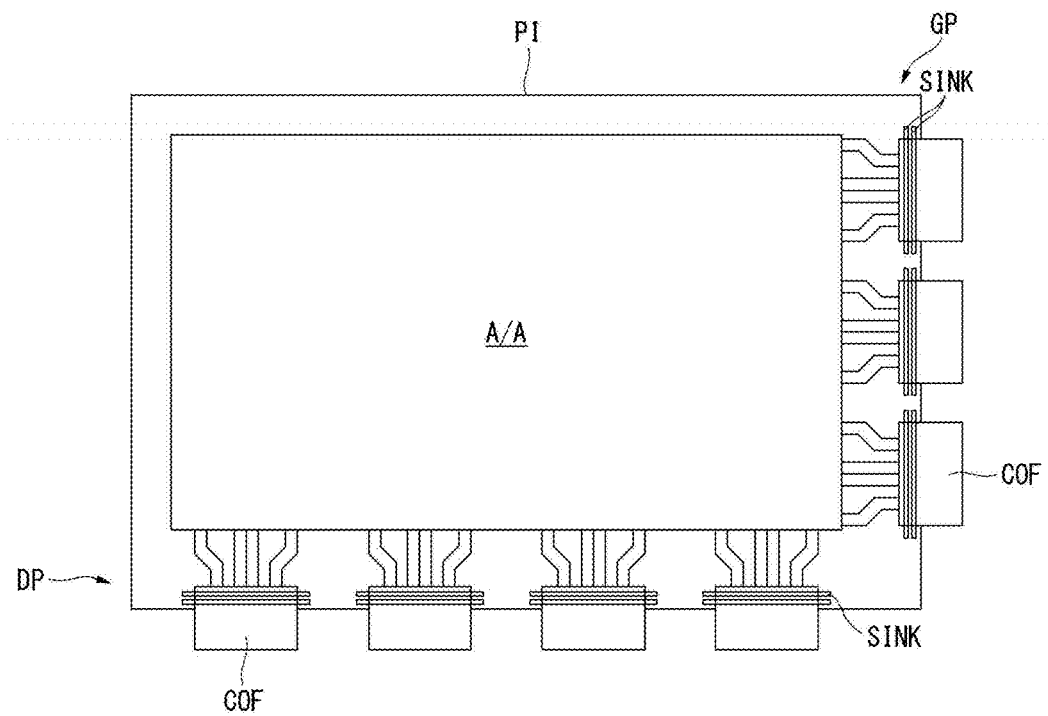

With reference to FIG. 13, the sink portion SINK may be included in each of the gate pad portion GP and the data pad portion DP. In this instance, the sink portion SINK of the gate pad portion GP may be discontinuously disposed in parallel with an end of the substrate PI and may be in plural. For example, six sink portions SINK of the gate pad portion GP may be disposed in parallel with an end of the substrate PI, and three groups each including two sink portions SINK may respectively overlap three flexible printed circuit boards COF. Further, the sink portion SINK of the data pad portion DP may be discontinuously disposed in parallel with an end of the substrate PI and may be in plural. For example, eight sink portions SINK of the data pad portion DP may be disposed in parallel with an end of the substrate PI, and four groups each including two sink portions SINK may respectively overlap four flexible printed circuit boards COF.

However, embodiments are not limited to the examples. For example, the number, the shape, the position, etc. of sink portions may be variously changed as long as the anisotropic conductive film included in the pad portion is prevented from overflowing from the substrate.

Figure 14:
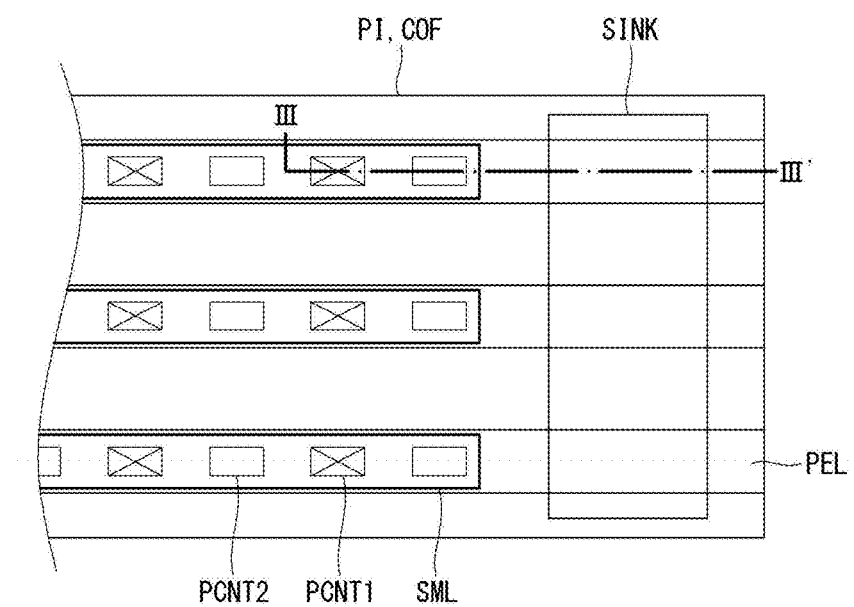
FIG. 14 is a plan view illustrating a pad portion of an OLED display according to a second example embodiment.
Figure 15:
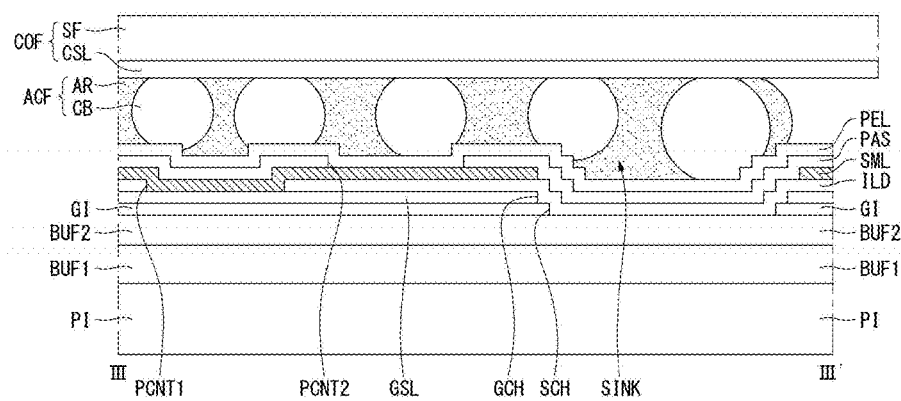
FIG. 15 is a cross-sectional view taken along line III-III' of FIG. 14.

FIG. 14 is a plan view illustrating a pad portion of an OLED display according to a second example embodiment. FIG. 15 is a cross-sectional view taken along line III-III' of FIG. 14. In the following description, a gate pad portion is described by way of example.

A detailed configuration of a gate pad portion according to a second example embodiment will be described with reference to FIGS. 14 and 15. A first buffer layer BUF1 is positioned on a substrate PI, and a second buffer layer BUF2 is positioned on the first buffer layer BUF1. A gate insulating layer GI is positioned on the second buffer layer BUF2 and has a second hole SCH in its portion. A gate signal line GSL is positioned on the gate insulating layer GI. The gate signal line GSL is a line extended from a gate line of a display area and has a third hole GCH in its portion. The third hole GCH of the gate signal line GSL is disposed corresponding to the second hole SCH of the gate insulating layer GI. An interlayer dielectric layer ILD is positioned on the gate signal line GSL and insulates the gate signal line GSL. The interlayer dielectric layer ILD has a first contact hole PCNT1 in its portion and exposes the gate signal line GSL through the first contact hole PCNT1. The interlayer dielectric layer ILD covers the second hole SCH of the gate insulating layer GI and the third hole GCH of the gate signal line GSL.

A source metal layer SML is positioned on the interlayer dielectric layer ILD and is connected to the gate signal line GSL through the first contact hole PCNT1 of the interlayer dielectric layer ILD. The source metal layer SML is formed along the interlayer dielectric layer ILD and covers the second hole SCH of the gate insulating layer GI and the third hole GCH of the gate signal line GSL. A passivation layer PAS is positioned on the source metal layer SML and has a second contact hole PCNT2 exposing the source metal layer SML in its portion. The passivation layer PAS is formed along the source metal layer SML and covers the second hole SCH of the gate insulating layer GI and the third hole GCH of the gate signal line GSL. A pad electrode PEL is positioned on the passivation layer PAS. The pad electrode PEL is connected to the source metal layer SML through the second contact hole PCNT2 of the passivation layer PAS. The pad electrode PEL is extended to an end of the substrate PI. Thus, the gate pad portion including the first buffer layer BUF1, the second buffer layer BUF2, the gate insulating layer GI, the gate signal line GSL, the interlayer dielectric layer ILD, the source metal layer SML, the passivation layer PAS, and the pad electrode PEL is formed.

A flexible printed circuit board COF is attached to the substrate PI of the gate pad portion through an anisotropic conductive film ACF. The flexible printed circuit board COF includes a flexible printed circuit line CSL included in a flexible film SF. The anisotropic conductive film ACF is configured such that a plurality of conductive balls CB is distributed in an adhesive resin AR. The anisotropic conductive film ACF electrically connects the substrate PI to the flexible printed circuit board COF while attaching the substrate PI to the flexible printed circuit board COF. Namely, the conductive balls CB of the anisotropic conductive film ACF contact the pad electrode PEL and the flexible printed circuit line CSL and electrically connect the pad electrode PEL to the flexible printed circuit line CSL.

In the second embodiment, a sink portion SINK is configured such that the second hole SCH of the gate insulating layer GI and the third hole GCH of the gate signal line GSL are disposed to overlap one another. The sink portion SINK intersects the pad electrode PEL and prevents the anisotropic conductive film ACF from being pushed out when the anisotropic conductive film ACF is pressed. Further, because the sink portion SINK is spaced apart from an end of the substrate PI, the sink portion SINK can prevent the anisotropic conductive film ACF from overflowing from the end of the substrate PI. A width W of the sink portion SINK may be equal to or greater than 70 μm under the condition that the sink portion SINK is spaced apart from the end of the substrate PI. Hence, the sink portion SINK holds the anisotropic conductive film ACF and can prevent the anisotropic conductive film ACF from overflowing from the end of the substrate PI. However, embodiments are not limited thereto. The width W of the sink portion SINK may be as large as possible under the condition that the sink portion SINK is included in the gate pad portion, and thus the sink portion SINK can prevent the anisotropic conductive film ACF from overflowing from the end of the substrate PI.

Unlike the first embodiment, in the second embodiment, the first buffer layer BUF1 may not have a first hole, and the pad electrode PEL is extended to the end of the substrate PI. Namely, the embodiments may form a hole in any layer disposed at a location corresponding to the sink portion and use the hole as the sink portion. In this instance, at least one of the gate signal line GSL, the source metal layer SML, and the pad electrode PEL is extended to the end of the substrate PI, and a test, etc. may be performed on at least one of the gate signal line GSL, the source metal layer SML, and the pad electrode PEL.

As described above, the display device according to the embodiments can prevent the anisotropic conductive film from overflowing from the substrate by forming the sink portion in the pad portion. Hence, the embodiments can prevent a defective drive and increase production yield by securing reliability of a separation process of a glass substrate.

Hereinafter, an example of the display device according to the embodiments is described. However, embodiments are not limited to the example.

Example Embodiment

An OLED display according to an example embodiment was manufactured as shown in FIG. 4. In this instance, each of a gate pad portion and a data pad portion according to the example embodiment included a sink portion, having a width of about 70 μm, as shown in FIG. 10.

COMPARATIVE EXAMPLE

An OLED display according to a comparative example was manufactured equally to an example embodiment.

However, each of a gate pad portion and a data pad portion according to the comparative example did not include a sink portion.

Figure 16:
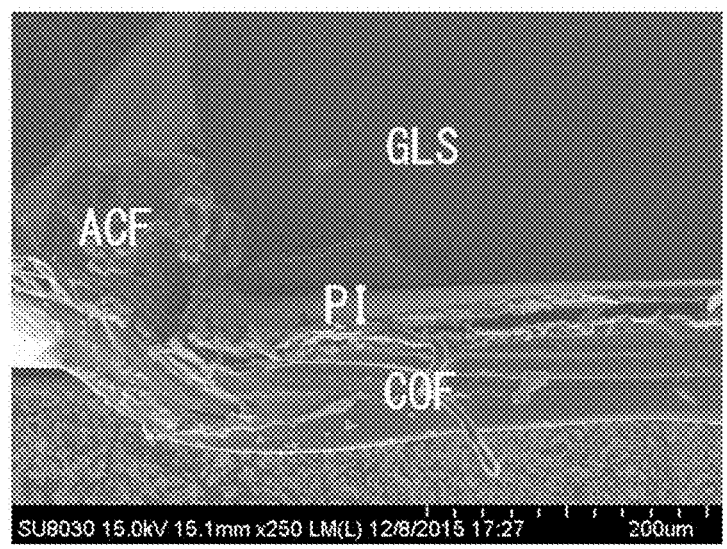
FIG. 16 illustrates an OLED display according to a comparative example.
Figure 17:
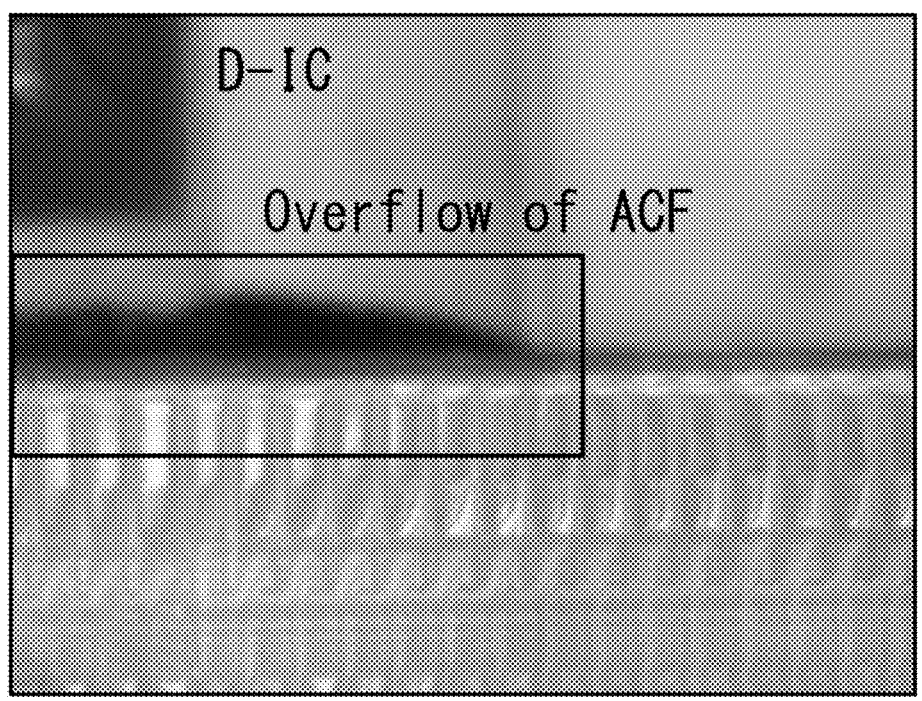
FIG. 17 illustrates a side image of an OLED display according to a comparative example.
Figure 18:
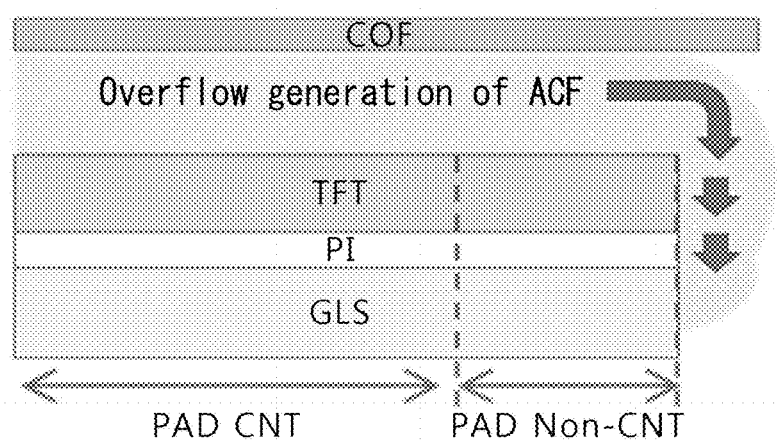
FIG. 18 illustrates a plan image of an OLED display according to a comparative example.
Figure 19:
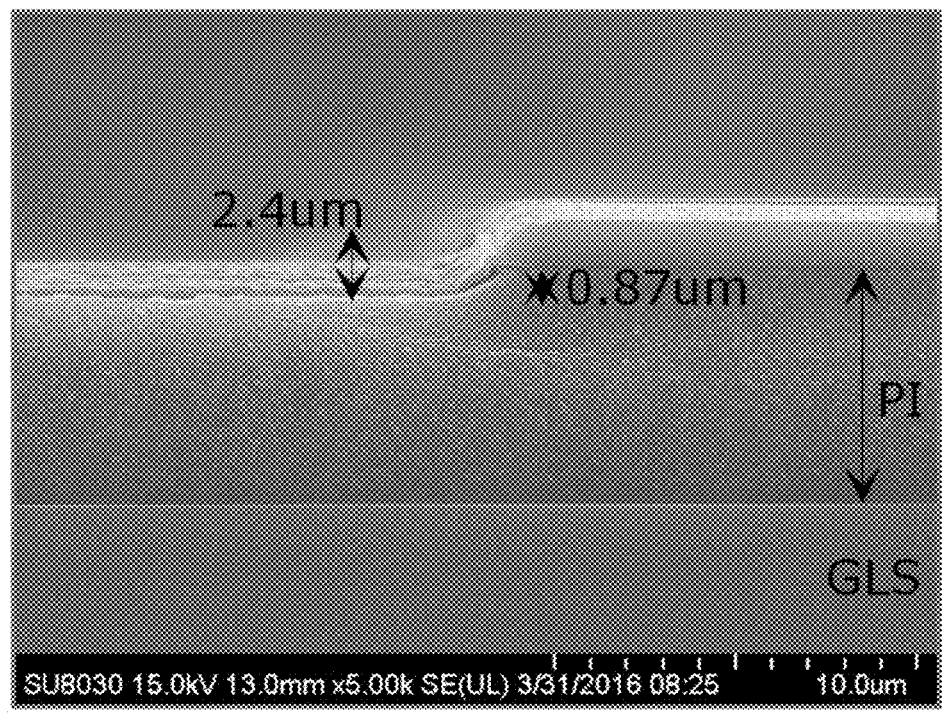
FIG. 19 illustrates an image of an OLED display according to an example embodiment.
Figure 20:
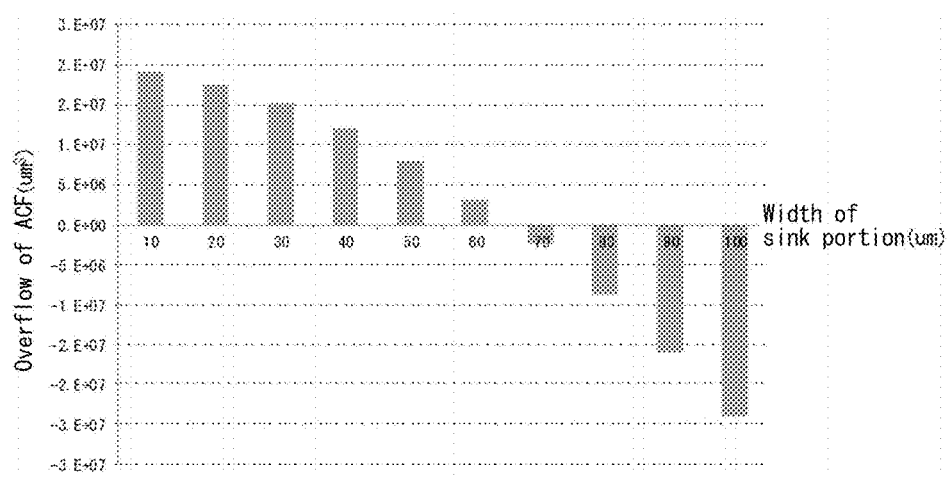
FIG. 20 is a graph illustrating an overflow amount of an anisotropic conductive film depending on a width of a sink portion of an OLED display according to an example embodiment.

FIG. 16 illustrates an OLED display according to a comparative example. FIG. 17 illustrates a side image of an OLED display according to a comparative example. FIG. 18 illustrates a plan image of an OLED display according to a comparative example. FIG. 19 illustrates an image of an OLED display according to an example embodiment. FIG. 20 is a graph illustrating an overflow amount of an anisotropic conductive film depending on a width of a sink portion of an OLED display according to an example embodiment.

In FIG. 16, a pad portion of the OLED display according to the comparative example is configured such that a substrate PI is positioned on a glass GLS, and a buffer layer, a gate insulating layer, an interlayer dielectric layer, etc. included in a TFT are positioned on the substrate PI. A flexible printed circuit board COF is attached to the pad portion through an anisotropic conductive film ACF. When the anisotropic conductive film ACF is pressed, the anisotropic conductive film ACF is spread while being pressed. In this instance, a portion of the anisotropic conductive film ACF overflows from the substrate PI and thus attaches the substrate PI to the side of the glass GLS. As can be seen from FIGS. 17 and 18, the anisotropic conductive film ACF overflowed from the substrate PI and the glass GLS. When the substrate PI was attached to the side of the glass GLS by the anisotropic conductive film ACF as described above, a problem (for example, non-separation) was generated in the separation between the substrate PI and the glass GLS in a process for separating the substrate PI from the glass GLS.

As can be clearly seen from FIG. 19, in an OLED display according to an example embodiment, a sink portion was formed in a pad portion. As shown in FIG. 20, when a width of the sink portion was 10 μm, 20 μm, 30 μm, 40 μm, 50 μm, and 60 μm, the anisotropic conductive film overflowed. However, when the width of the sink portion was equal to or greater than 70 μm, the overflow of the anisotropic conductive film was not generated.

As described above, the display device according to the embodiments can prevent the anisotropic conductive film from overflowing from the substrate by forming the sink portion in the pad portion. Hence, the embodiments can prevent a defective drive and increase production yield by securing reliability of the separation process of the glass substrate.

It will be apparent to those skilled in the art that various modifications and variations can be made in the display device of the present disclosure without departing from the spirit or scope of the invention. Thus, it is intended that the present disclosure cover the modifications and variations provided they come within the scope of the appended claims and their equivalents.

What is claimed is:

1. A method of manufacturing a display device, comprising:
    providing a substrate, the substrate defining a display area on the substrate and configured to display an image, and a pad portion on at least one edge of the substrate, the pad portion including at least one sink portion;
    forming an anisotropic conductive film on the pad portion and filling the at least one sink portion, the anisotropic conductive film spaced apart from an end of the substrate; and
    providing a flexible printed circuit board on the anisotropic conductive film and electrically connected to the pad portion,
    wherein the pad portion further includes:
    a first buffer layer on the substrate;
    a second buffer layer on the first buffer layer;
    a gate insulating layer on the second buffer layer;
    a first line on the gate insulating layer;
    an interlayer dielectric layer on the first line;
    a second line on the interlayer dielectric layer;
    a passivation layer on the second line; and
    a pad electrode on the passivation layer.

2. The method of claim 1, wherein the pad portion includes a plurality of lines extended from the end of the substrate, and wherein the at least one sink portion intersects the plurality of lines.

3. The method of claim 1, wherein the sink portion includes holes in the second buffer layer, the gate insulating layer, and the first line.

4. The method of claim 1, wherein the sink portion includes holes in the second buffer layer, the gate insulating layer, and the interlayer dielectric layer.

5. The method of claim 1, wherein the sink portion includes holes in the gate insulating layer and the first line.

6. The method of claim 1, wherein the pad portion includes a gate pad portion and a data pad portion, and wherein the sink portion is continuously disposed in each of the gate pad portion and the data pad portion.

7. The method of claim 1, wherein the pad portion includes a gate pad portion and a data pad portion, and wherein the sink portion is discontinuously disposed in each of the gate pad portion and the data pad portion.

8. The method of claim 1, wherein the sink portion includes a plurality of sink portions disposed in parallel with the end of the substrate.

9. The method of claim 1, wherein a width of the sink portion is equal to or greater than 70 μm.

10. A method of manufacturing a display device, comprising:
    providing a substrate, the substrate defining a display area on the substrate and configured to display an image, and a pad portion on at least one edge of the substrate, the pad portion including a pad electrode and a sink portion; and
    forming an anisotropic conductive film on the pad portion and filling the sink portion,
    wherein the sink portion is disposed between the pad electrode and an end of the substrate.

11. The method of claim 10, wherein the anisotropic conductive film spaced apart from the end of the substrate.

12. The method of claim 10, further providing a flexible printed circuit board on the anisotropic conductive film and electrically connected to the pad portion.

13. The method of claim 10, wherein the sink portion disposed in parallel with the end of the substrate.

* * * * *